(12) United States Patent
Lan et al.

(10) Patent No.: US 9,368,630 B2
(45) Date of Patent: Jun. 14, 2016

(54) THIN FILM TRANSISTOR AND METHOD FOR MANUFACTURING THIN FILM TRANSISTOR

(71) Applicant: E Ink Holdings Inc., Hsinchu (TW)

(72) Inventors: Wei-Chou Lan, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 16 days.

(21) Appl. No.: 13/751,168

(22) Filed: Jan. 28, 2013

(65) Prior Publication Data

US 2013/0256670 A1 Oct. 3, 2013

Related U.S. Application Data

(60) Provisional application No. 61/619,433, filed on Apr. 3, 2012.

(30) Foreign Application Priority Data

Oct. 2, 2012 (TW) .............................. 101136374 A

(51) Int. Cl.
*H01L 29/78* (2006.01)
*H01L 29/786* (2006.01)
(Continued)

(52) U.S. Cl.
CPC .......... *H01L 29/786* (2013.01); *H01L 27/1248* (2013.01); *H01L 29/42384* (2013.01); *H01L 29/66742* (2013.01)

(58) Field of Classification Search
CPC .............. H01L 29/786; H01L 27/1248; H01L 29/42384; H01L 29/66742
USPC ............ 257/59, E51.005, E29.273, E29.276, 257/E29.28, E29.29, E21.625, 52, 57, 64, 257/66, 40
See application file for complete search history.

(56) References Cited

U.S. PATENT DOCUMENTS 7,569,851 B2 * 8/2009 Song et al. ....................... 257/40
7,679,085 B2 * 3/2010 Jun et al. ......................... 257/59
(Continued)

FOREIGN PATENT DOCUMENTS

| CN | 1409417 A | 4/2003 |
|---|---|---|
| CN | 1753202 A | 3/2006 |

(Continued)

OTHER PUBLICATIONS

TW Office Action.
(Continued)

*Primary Examiner* — Matthew Reames
*Assistant Examiner* — Vincent Wall
(74) *Attorney, Agent, or Firm* — CKC & Partners Co., Ltd.

(57) ABSTRACT

A thin film transistor is disclosed. The drain and source electrode layer of the thin film transistor is disposed on the substrate, in which the drain and source electrode layer is divided into a drain region and a source region. The semiconductor layer and the first insulating layer are disposed on the drain and source electrode layer, in which the first insulating layer has an upper limit of thickness. The second insulating layer is disposed on the semiconductor layer and the first insulating layer, in which the second insulating layer has a lower limit of thickness. The gate electrode layer is disposed on the second insulating layer. The passivation layer is disposed on the gate electrode layer, and the pixel electrode layer is disposed on the passivation layer.

17 Claims, 5 Drawing Sheets

(51) Int. Cl.
*H01L 29/66* (2006.01)
*H01L 29/423* (2006.01)
*H01L 27/12* (2006.01)

(56) References Cited

U.S. PATENT DOCUMENTS

| | | | |
|---|---|---|---|
| 8,670,081 B2* | 3/2014 | Yang | G02F 1/1362 349/43 |
| 2005/0104058 A1* | 5/2005 | Veres et al. | 257/40 |
| 2006/0060855 A1* | 3/2006 | Lee et al. | 257/59 |
| 2006/0081849 A1* | 4/2006 | Lee et al. | 257/72 |
| 2009/0166612 A1 | 7/2009 | Cain et al. | |
| 2011/0281394 A1* | 11/2011 | Yamazaki | 438/104 |

FOREIGN PATENT DOCUMENTS

| | | |
|---|---|---|
| CN | 101997006 A | 3/2011 |
| JP | H02206132 A | 8/1990 |
| JP | 2001244467 A | 9/2001 |
| JP | 2006229185 A | 8/2006 |
| JP | 2009021276 A | 1/2009 |

OTHER PUBLICATIONS

Corresponding Chinese Office Action.
Corresponding Chinese Office Action, Dec. 24, 2015.

* cited by examiner

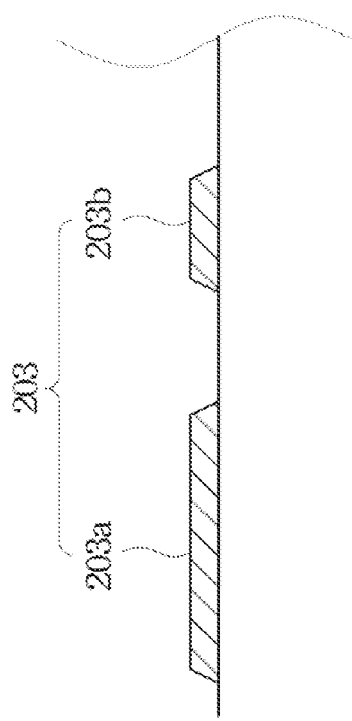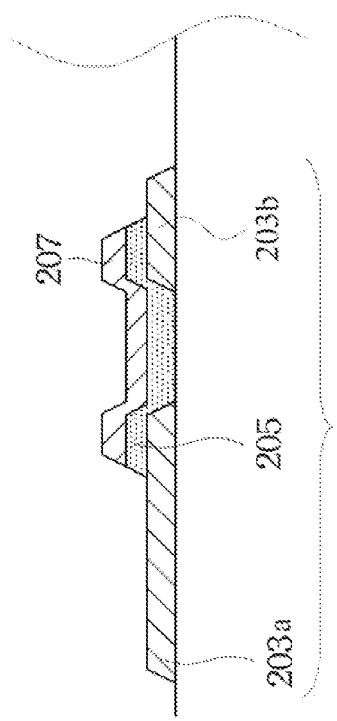

THIN FILM TRANSISTOR AND METHOD FOR MANUFACTURING THIN FILM TRANSISTOR

RELATED APPLICATIONS

This application claims the priority benefit of provisional application Ser. No. 61/619,433, filed Apr. 3, 2012, the full disclosure of which is incorporated herein by reference. This application also claims the priority benefit of Taiwan application serial no. 101136374, filed Oct. 2, 2012, the full disclosure of which is incorporated herein by reference.

BACKGROUND

1. Field of Invention

The present invention relates to a transistor. More particularly, the present invention relates to a thin film transistor.

2. Description of Related Art

Digital circuit integration is very popular in semiconductor device manufacturing field, and enables the electronic and information industry to progress rapidly as well. In recent years, applications of the digital technology have been extended to some analog fields. Traditionally, an integrated circuit has only one single dielectric layer. However, as the design of the integrated circuit becomes more and more complicated, one single dielectric layer cannot meet the requirement of a new generation integrated circuit. In a conventional manufacturing process of a high-voltage component, a relatively thick gate oxide layer needs to be developed for sustaining a high pressure working environment.

In the design of a thin-film transistor, a gate electrode and a source/drain electrode can be either partially overlapped or separated without overlapping. If the electrodes are separated without overlapping, a uniformity problem may arise due to poor alignment during an etching process, which affects electrical properties of the thin film transistor, and an allowable gate line width due to the limit of minimum resolution.

On the other hand, if in the thin-film transistor the source electrode and the gate electrode or the drain electrode and the gate electrode are made to be overlapped, although the photocurrent problem can be prevented, however, yet the overlapped electrodes will produce stray capacitance, which slows down the transistor operation speed. In addition, some material layers of the thin film transistor require to be formed by a continuous film-forming process, in which case the thickness of the dielectric layer needs to be increased to reduce the stray capacitance, the conduction current will be reduced due to the increased thickness of the dielectric layer, thus affecting the transistor performance.

SUMMARY

According to one embodiment of the present invention, a thin film transistor is disclosed. The thin film transistor includes a drain and source electrode layer, a semiconductor layer and a first insulating layer, a second insulating layer, a gate electrode layer, a passivation layer and a pixel electrode layer. The drain and source electrode layer is disposed on a substrate, in which the drain and source electrode layer is divided into a drain region and a source region. The semiconductor layer and the first insulating layer are disposed on the drain and source electrode layer, in which the first insulating layer has an upper limit of thickness. The second insulating layer is disposed on the semiconductor layer and the first insulating layer, in which the second insulating layer has a lower limit of thickness. The gate electrode layer is disposed on the second insulating layer. The passivation layer is disposed on the gate electrode layer. The pixel electrode layer is disposed on the passivation layer.

According to another embodiment of the present invention, a method for manufacturing a thin film transistor is disclosed. In the method, a substrate is provided and a drain and source electrode layer is formed on the substrate. Next, the drain and source electrode layer is divided into a drain region and a source region, and a semiconductor layer and a first insulating layer are formed on the drain and source electrode layer, in which a thickness of the first insulating layer is made smaller than or equal to a first thickness standard value. Thereafter, a second insulating layer is formed on the semiconductor layer and the first insulating layer, in which a thickness of the second insulating layer is made equal to or greater than a second thickness standard value. Subsequently, a gate electrode layer, a passivation layer and a pixel electrode layer are sequentially formed and stacked on the second insulating layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 2A to FIG. 2F are schematic cross-sectional views showing a process of manufacturing a thin film transistor according to one embodiment of the present invention.

DETAILED DESCRIPTION

Figure 1:
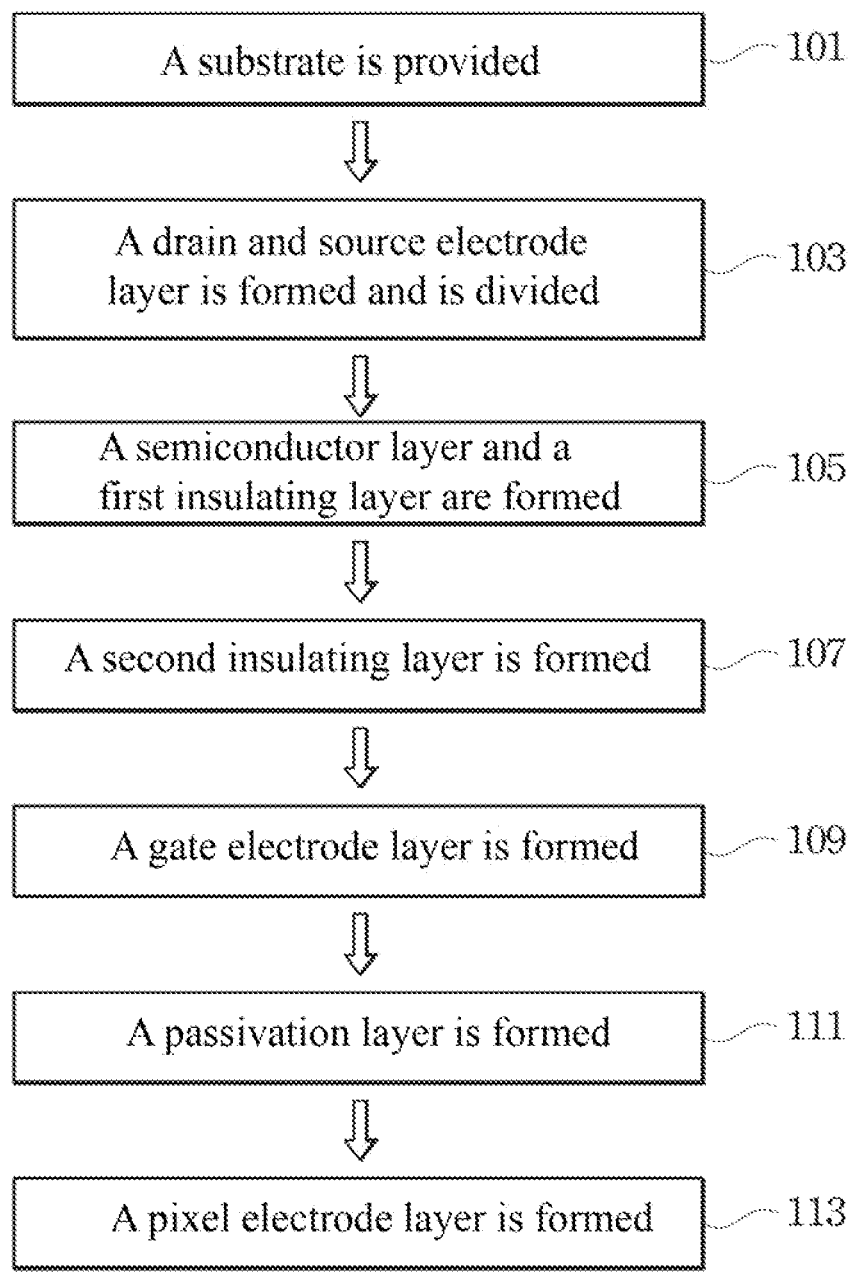
FIG. 1 is a flowchart showing a method for manufacturing a thin film transistor according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

A thin film transistor and a manufacturing method thereof shown in the following embodiments adjust a thickness or a permittivity of an individual insulating layer disposed between electrode layers to reduce stray capacitances and to increase the operation speed of the thin film transistor.

FIG. 1 is a flowchart showing a method for manufacturing a thin film transistor according to one embodiment of the present invention, and FIG. 2A to FIG. 2F are schematic cross-sectional views showing the process of manufacturing a thin film transistor according to one embodiment of this invention. In the steps of the method for manufacturing a thin film transistor, a substrate 201 is first provided (step 101), and a drain and source electrode layer is formed on the substrate, and the drain and source electrode layer is divided into a drain region 203b and a source region 203a (step 103). The drain region 203b and the source region 203a are positioned on the same plane and have substantially the same height levels, thereby reducing the inaccurate alignment possibility during the gate electrode etching process, thus reducing an unevenness caused by a material layer critical dimension loss (CD Loss).

Thereafter, a semiconductor layer 205 and a first insulating layer 207 are formed on the drain and source electrode layer 203 (step 105), in which a thickness of the first insulating layer 207 is made smaller than or equal to a first thickness standard value (that is, the thickness of the first insulating layer 207≤the first thickness standard value). Specifically, the thickness of the first insulating layer 207 is smaller than or equal to the first thickness standard value 3000 Å (angstrom: $10^{-10}$ m). More specifically, the thickness of the first insulating layer 207 is equal to or greater than 500 Å and is smaller than or equal to 3000 Å. (That is, 500 Å≤thickness of the first insulating layer 207≤3000 Å).

After step 105, a second insulating layer 209 is formed on the semiconductor layer 205 and the first insulating layer 207 (step 107), in which a thickness of the second insulating layer 209 is made equal to or greater than a second thickness standard value. For example, the thickness of the second insulating layer 209 is made equal to or greater than a second thickness standard value 1500 Å. More specifically, the thickness of the second insulating layer 209 is made equal to or greater than 1500 Å and is smaller than or equal to 2 μm. In this embodiment, the thickness of the first insulating layer 207 is made smaller than the thickness of the second insulating layer 209. The first insulating layer 207 is made as thin as possible to be operable such that the conduction current value can be increased. Another way to increase the value of the conduction current is to employ high permittivity material, such as nitrogen silicon compounds (SiNx) and oxygen silicon compounds (SiOx), as the first insulating layer 207. The second insulating layer 209 is made as thick as possible to be operable such that the stray capacitance existing between the gate and the source or between the gate and the drain can be reduced. Another way to reduce the stray capacitance is to employ the low permittivity material, such as organic materials or resins, to be the second insulating layer 209.

After the second insulating layer 209 is formed, a gate electrode layer 211, a passivation layer 213 and a pixel electrode layer 215 are sequentially formed and stacked on the second insulating layer 209 (step 109, step 111, and step 113). Positions of the drain region 203b, the source region 203a and the gate electrode layer 211 can be partially overlapped to prevent photocurrent which is produced when the semiconductor structure is illuminated by light. In fact, the method for manufacturing the TFT of this embodiment employ six masks lithography etching process (from step 103 to step 113) to form the various layers of the thin film transistor.

Figure 2C:
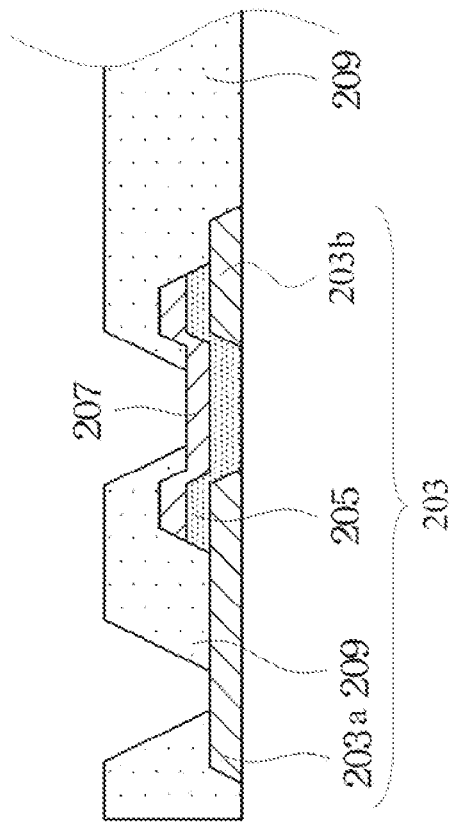
Figure 2D:
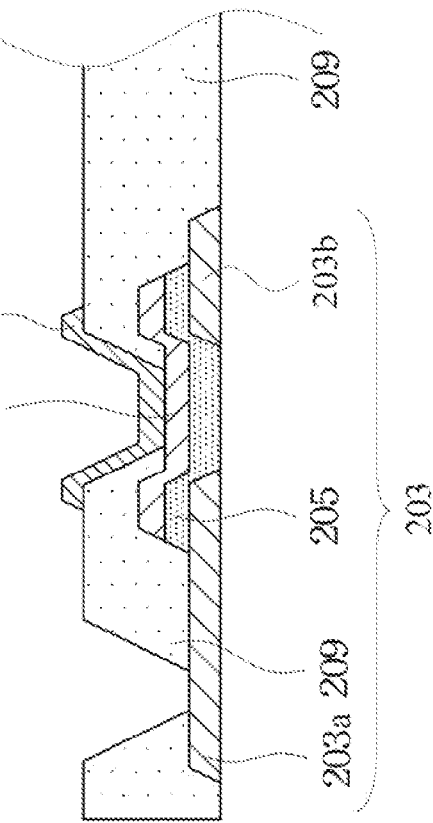
Figure 2E:
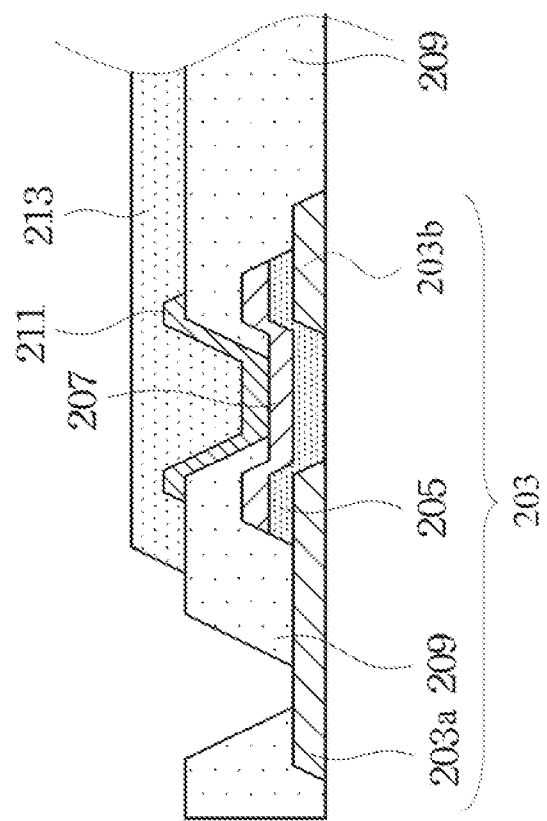
Figure 2F:
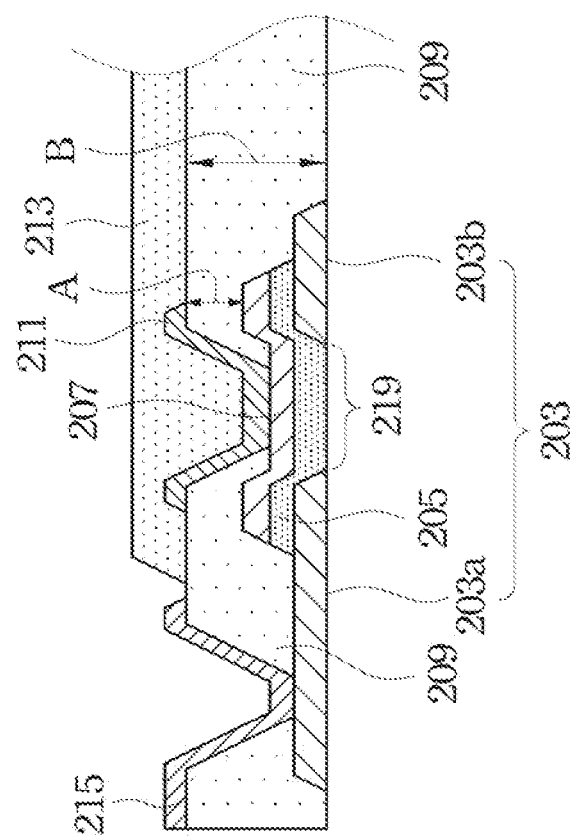

As shown in FIG. 2F, which is a schematic cross-sectional view of the thin film transistor depicted in, the thin film transistor 200 substantially includes a drain and source electrode layer 203, a semiconductor layer 205, a first insulating layer 207, a second insulating layer 209, a gate electrode layer 211, a passivation layer 213 and a pixel electrode layer 215.

The drain and source electrode layer 203 is disposed on a substrate 201, in which the drain and source electrode layer 203 is divided into a source region 203a and a drain region 203b. A contact 219 is located between the source region 203a and the drain region 203b which are positioned on the same plane so as to reduce the unevenness due to the critical dimension loss (CD Loss) during the electrode etching process. The semiconductor layer 205, which can optionally formed from polysilicon, and the first insulating layer 207 are disposed on the drain and source electrode layer 203. The semiconductor layer 205 and the first insulating layer 207 are filled in the contact 219, in which the first insulating layer 207 has an upper limit of thickness. For instance, the thickness of the first insulating layer 207 is made smaller than or equal to 3000 Å. More specifically, the thickness of the first insulating layer 207 is made equal to or greater than 500 Å and is made less than or equal to 3000 Å.

The second insulating layer 209, which is substantially formed from a low permittivity material such as an organic material or a resin, is disposed on the semiconductor layer 205 and the first insulating layer 207. The permittivity of the second insulating layer 209 is smaller than the permittivity of the first insulating layer 207, and the second insulating layer 209 has a lower limit of thickness. For example, the thickness of the second insulating layer 209 is made equal to or greater than 1500 Å. Further, the thickness of the second insulating layer 209 is made equal to or greater than 1500 Å and is made smaller than or equal to 2 μm such that the first insulating layer 207 is thinner than the second insulating layer 209. In addition, the thickness of the second insulating layer 209 varies as required. For instance, the second insulating layer 209 have two kinds of thickness, i.e., the thickness A and thickness B as shown in FIG. 2F, to comply with the TFT structure regulation.

The gate electrode layer 211 is disposed on the second insulating layer 209. The drain region 203b, the source region 203a and the gate electrode layer 211 are partially overlapped. The passivation layer 213 is disposed on the gate electrode layer 211, and the pixel electrode layer 215 is disposed on the passivation layer 213. In this embodiment, the drain and source electrode layer 203, the semiconductor layer 205, the first insulating layer 207, the second insulating layer 209, the passivation layer 213 and the pixel electrode layer 215 form a top gate structure.

In this embodiment, the thickness of the second insulating layer 209 can be increased to reduce the influence of the stray capacitance. In further, a low permittivity material, such as organic materials or resins, can be employed to form the second insulating layer 209, which further reduces the influence of the stray capacitance.

The thin film transistor and the manufacturing method thereof according to the above embodiments increase the thickness of the second insulating layer disposed between the electrode layers to reduce the stray capacitance, such that the operation speed of the thin film transistor can be increased. The second insulating layer can be formed from a low permittivity material to further reduce the stray capacitance. Meanwhile, a thin first insulating layer is employed to prevent the conduction current value from being decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A thin film transistor, comprising:
   a drain and source electrode layer disposed on a substrate, wherein the drain and source electrode layer is divided into a drain region and a source region;
   a semiconductor layer and a first insulating layer disposed on the drain and source electrode layer, wherein the semiconductor layer has a first recess, and the first insulating layer is conformally disposed on the semiconductor layer, and the first insulating layer has a second recess;
   a second insulating layer disposed on the semiconductor layer and the first insulating layer, wherein a part of the second recess of the first insulating layer is overlapped by a part of the second insulating layer, wherein the second insulating layer has an opening exposing a portion of the first insulating layer;
   a gate electrode layer formed in the opening of the second insulating layer and in contact with the exposed portion of the first insulating layer, wherein the gate electrode layer covers the opening of the second insulating layer, and extends from a bottom of the opening along a sidewall of the opening to a top surface of the second insulating layer, and a portion of the second insulating layer is sandwiched between the gate electrode layer and the first insulating layer;

a passivation layer disposed on the gate electrode layer; and a pixel electrode layer disposed on the passivation layer, wherein the permittivity of the second insulating layer is smaller than the permittivity of the first insulating layer, and a thickness of the first insulating layer is smaller than a thickness of the second insulating layer, wherein the second recess is filled by the second insulation layer and the gate electrode layer, and the gate electrode directly contacts the first insulating layer.

2. The thin film transistor as claimed in claim 1, wherein a thickness of the first insulating layer is smaller than or equal to 3000 Å.

3. The thin film transistor as claimed in claim 1, wherein a thickness of the first insulating layer is equal to or greater than 500 Å and is smaller than or equal to 3000 Å.

4. The thin film transistor as claimed in claim 1, wherein a thickness of the second insulating layer is equal to or greater than 1500 Å.

5. The thin film transistor as claimed in claim 1, wherein a thickness of the second insulating, layer is equal to or greater than 1500 Å and is smaller than or equal to 2 µM.

6. The thin film transistor as claimed in claim 1, wherein the drain and source electrode layer, the semiconductor layer, the first insulating layer, the second insulating layer, the passivation layer and the pixel electrode layer form a top gate structure.

7. The thin film transistor as claimed in claim 1, wherein the drain region and the source region are positioned on the same plane.

8. The thin film transistor as claimed in claim 1, wherein the second insulating layer contacts the substrate, and has a bottom surface that is level with bottom surfaces of the drain region and the source region.

9. The thin film transistor as claimed in claim 1, wherein the second insulating layer directly contacts side walls of the first insulating layer, the semiconductor layer, and the drain region.

10. The thin film transistor as claimed in claim 1, wherein the material of the first insulating layer includes nitrogen silicon compounds (SiNx) and oxygen silicon compounds (SiOx), and the material of the second insulating layer includes an organic material or a resin.

11. A method for manufacturing a thin film transistor, comprising:

providing a substrate;

forming a drain and source electrode layer on the substrate and dividing the drain and source electrode layer into a drain region and a source region;

forming a semiconductor layer and a first insulating layer on the drain and source electrode layer, wherein the semiconductor layer is formed to have a first recess, and the first insulating layer is conformally formed on the semiconductor layer, and the first insulating layer is formed to have a second recess;

forming a second insulating layer on the semiconductor layer and the first insulating layer, wherein a part of the second recess of the first insulating layer is covered by a part of the second insulating layer, wherein an opening of the second insulating layer exposes a portion of the first insulating layer;

forming a gate electrode layer in the opening of the second insulating layer and in contact with the exposed portion of the first insulating layer, wherein the gate electrode layer covers the opening, of the second insulating layer, and extends from a bottom of the opening along a sidewall of the opening to a top surface of the second insulating layer, and a portion of the second insulating layer is sandwiched between the gate electrode layer and the first insulating layer;

forming a passivation layer on the gate electrode layer; and forming a pixel electrode layer on the passivation layer, wherein the permittivity of the second insulating layer is smaller than the permittivity of the first insulating layer, and a thickness of the first insulating layer is smaller than a thickness of the second insulating layer, wherein the second recess is filled by the second insulation layer and the gate electrode layer, and the gate electrode directly contacts the first insulating layer.

12. The method as claimed in claim 11, wherein the thickness of the first insulating layer is made smaller than or equal to 3000 Å.

13. The method as claimed in claim 11, wherein the thickness of the first insulating layer is made equal to or greater than 500 Å and is made less than or equal to 3000 Å.

14. The method as claimed in claim 11, wherein the thickness of the second insulating layer is made equal to or greater than 1500 Å.

15. The method as claimed in claim 11, wherein the drain region and the source region are disposed on the same plane.

16. The method as claimed in claim 11, wherein the drain region, the source region and the gate electrode layer are partially overlapped.

17. The method as claimed in claim 11, wherein the high permittivity material includes nitrogen silicon compounds (SiNx) and oxygen silicon compounds (SiOx), and the low permittivity material includes an organic material or a resin.

* * * * *